United States Patent
Roca I Cabaroccas et al.

(10) Patent No.: US 11,574,807 B2
(45) Date of Patent: Feb. 7, 2023

(54) PROCESS FOR MANUFACTURING TRANSFERABLE THIN LAYER

(71) Applicants: Centre national de la recherche scientifique, Paris (FR); INSTITUT PHOTOVOLTAÏQUE D'ILE DE FRANCE (IPVF), Antony (FR); ECOLE POLYTECHNIQUE, Palaiseau (FR); L'AIR LIQUIDE, SOCIETE ANONYME POUR L'ETUDE ET L'EXPLOITATION DES PROCEDES GEORGES CLAUDE, Paris (FR); TOTAL SA, Courbevoie (FR); ELECTRICITE DE FRANCE, Paris (FR)

(72) Inventors: Père Roca I Cabaroccas, Villebon sur Yvette (FR); Wanghua Chen, Bures sur Yvette (FR); Romain Cariou, Bourg-la-Reine (FR)

(73) Assignees: CENTRE NATIONAL DE LA RECHERCHE SCIENTIFIQUE, Paris (FR); INSTITUT PHOTOVOLTAÏQUE D'ILE DE FRANCE (IPVF), Palaiseau (FR); ECOLE POLYTECHNIQUE, Palaiseau (FR); TOTALENERGIES SE, Paris la Défense (FR); ELECTRICITE DE FRANCE, Paris (FR)

( * ) Notice: Subject to any disclaimer, the term of this patent is extended or adjusted under 35 U.S.C. 154(b) by 122 days.

(21) Appl. No.: 16/764,176

(22) PCT Filed: Nov. 15, 2018

(86) PCT No.: PCT/EP2018/081461
§ 371 (c)(1),
(2) Date: May 14, 2020

(87) PCT Pub. No.: WO2019/096947
PCT Pub. Date: May 23, 2019

(65) Prior Publication Data
US 2020/0395212 A1    Dec. 17, 2020

(30) Foreign Application Priority Data
Nov. 15, 2017  (FR) ...................... 1760749

(51) Int. Cl.
*H01L 21/02*    (2006.01)
*H01L 29/16*    (2006.01)

(52) U.S. Cl.
CPC .. *H01L 21/02274* (2013.01); *H01L 21/02381* (2013.01); *H01L 29/16* (2013.01)

(58) Field of Classification Search
CPC ........ H01L 21/02274; H01L 21/02381; H01L 29/16; H01L 21/0262; H01L 21/02532; H01L 21/0245; H01L 21/02513
See application file for complete search history.

(56) References Cited

U.S. PATENT DOCUMENTS

| 9,349,864 | B1 | 5/2016 | Mcardel et al. |
| 9,620,356 | B1 | 4/2017 | Bashyam et al. |
| 2012/0208358 | A1 | 8/2012 | Roca U Cabarrocas et al. |

FOREIGN PATENT DOCUMENTS

JP    2003-17723 A    1/2003

OTHER PUBLICATIONS

Canarrocas, P. R., et al. "Low temperature plasma deposition of silicon thin films: From amorphous to crystalline" Journal of Non-Crystalline Solids 358:2000-2003 (2012) cited in Specification.

(Continued)

*Primary Examiner* — Jack S Chen
(74) *Attorney, Agent, or Firm* — Troutman Pepper Hamilton Sanders LLP

(57) ABSTRACT

The invention relates to a process for the preparation of a semiconductor material comprising at least one entirely monocrystalline semiconductor layer, said process comprising the steps of preparation of the surface of a first substrate to receive a monocrystalline silicon layer; deposition by Plasma-Enhanced Chemical Vapor Deposition (PECVD) of a layer of monocrystalline silicon by epitaxial growth with a growth rate gradient on the silicon layer monocrystalline obtained in step (i); and epitaxial growth of a monocrystalline layer of a semiconductor material on the monocrystal- (Continued)

line silicon layer obtained in step (ii), to thus obtain a material comprising at least one entirely monocrystalline semiconductor layer. The invention also relates to a multi-layer material comprising a monocrystalline layer of semiconductor material.

18 Claims, 1 Drawing Sheet

(56) References Cited

OTHER PUBLICATIONS

Rapport De Recherche Internatioale issued in corresponding International Patent Application No. PCT/EP2018/081461 dated Feb. 18, 2019 (in French).
Rapport De Recherche Préliminaire issued in corresponding French Patent Application No. 1760749 dated Sep. 23, 2018 (in French).
Hadjadj A., et al. "Ellipsometry investigation of the amorphous-to-microcrystalline transition in a-Si:H under hydrogen-plasma treatement" Journal of Applied Physics 107(083509):1-9 (2010) cited in ISR and FR SR.

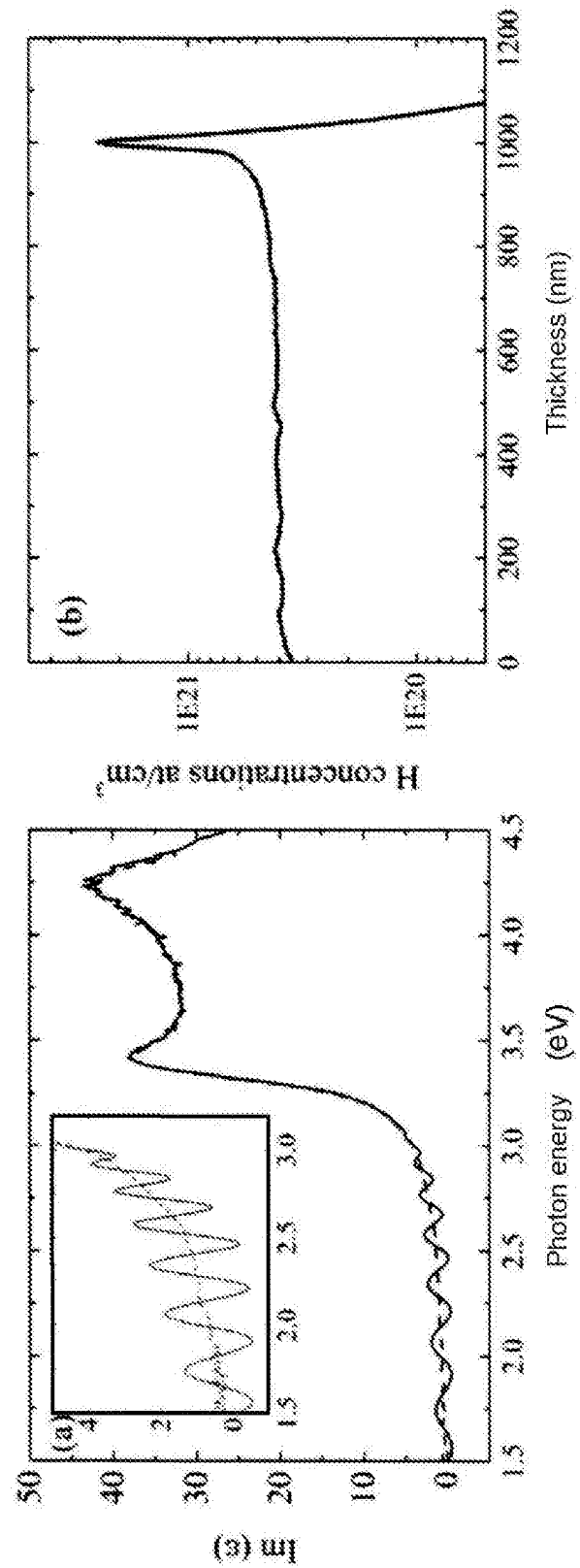

PROCESS FOR MANUFACTURING TRANSFERABLE THIN LAYER

CROSS REFERENCE TO RELATED APPLICATIONS

This is a U.S. National Phase Application under 35 U.S.C. § 371 of International Patent Application No. PCT/EP2018/081461, filed Nov. 15, 2018, which claims priority of French Patent Application No. 1760749, filed Nov. 15, 2017. The entire contents of which are hereby incorporated by reference.

FIELD OF THE INVENTION

The present invention relates to the field of devices comprising one or more thin layers, also referred to as multilayer material, electronic or optoelectronic devices, and, in particular, semiconductor devices, and, in particular, photovoltaic cells. The invention also relates to the field of nanotechnologies, optoelectronics and photovoltaics.

BACKGROUND

Various processes for manufacturing devices comprising thin layers are known from the prior art. Particularly known are various processes for preparing semiconductor devices, in particular for the manufacture of photovoltaic cells. Among these techniques, we find the preparation of thin layers by epitaxy. Once the thin layer is epitaxialated, it is possible to delaminate or detach this layer from its substrate and transfer it to another substrate of interest, or, for example, less expensive. For this delamination or detachment, the following processes may be cited as examples:

- The SOITEC Smartcut™ process for transferring thin crystalline layers from a donor substrate to a support substrate. This technology is based on the association of the implantation of light ions, in particular hydrogen, and bonding by molecular adhesion, so as to transfer ultrafine monocrystalline layers from one substrate to another;
- Processes based on the use of porous silicon: at least two regions with different porosities are created below the surface of the substrate by electrochemical etching in HF solution, before epitaxy. An annealing treatment at high temperature makes it possible to break the porous region in order to detach the part of interest;
- Sacrificial layer processes acting as a crystalline buffer for epitaxial growth, and which may be etched or removed after deposition. This process is mainly used for epitaxial III-V semiconductors.

However, these processes are either expensive, difficult to implement, or limited in their applications. The disadvantage of these processes is that they involve steps for implanting H+ ions, and/or heat treatment at high temperature (>700° C.), wherein said steps are complicated to implement and costly. High temperature annealing also limits the processes to crystalline silicon substrates or refractory materials that are capable of withstanding the annealing temperature. Epitaxial growth has already proved itself as an appropriate route for the production of ultrafine monocrystalline layers, in particular since it allows perfect control of the thickness of the layer and doping. In addition, growth may be carried out at low temperature (<200° C.), so that epitaxy becomes a low-cost process. However, in this type of process, the transfer of the epitaxial layers to a low-cost substrate is a crucial step. Thus, there is a need to develop innovative processes to respond to existing technical problems.

SUMMARY

The present invention aims to solve the technical problem of providing a process for manufacturing a crystalline semiconductor material comprising at least one fully monocrystalline semiconductor layer that is easily detachable from the substrate on which the semiconductor layer(s) is/are prepared, in particular for the purpose of transferring the semiconductor layer(s) onto another substrate, preferably those at low cost or having properties of interest. In particular, it is desired to use a second substrate having, for example, a lower cost than the first substrate, or a flexible substrate. The present invention aims to solve the technical problem of providing a process in which the first substrate may be recycled.

The present invention also aims to solve the technical problem of providing a process of manufacturing an inexpensive multilayer semiconductor material.

The present invention also aims to solve the technical problem of providing a process for manufacturing a multilayer semiconductor material that is easy to implement, in particular for various industrial applications.

The present invention also aims to solve the technical problem of providing a process for the preparation of photovoltaic cells.

The present invention also aims to solve the technical problem of providing new multilayer semiconductor materials, for example for photovoltaic cell applications, in particular for photovoltaic cells whose substrate is not that of growth.

The present invention also aims to solve the technical problem of providing materials comprising one or more semiconductor layers deposited on a supple or flexible substrate.

The present inventors have discovered a new preparation process which makes it possible to solve one or more of the technical problems stated above. This process allows the preparation of semiconductor materials to solve one or more of the technical problems stated above.

The present invention relates, in particular, to a process for the preparation of a semiconductor material comprising at least one entirely monocrystalline semiconductor layer, said process comprising the steps of:

(i) the preparation of the surface of a first substrate to receive a layer of monocrystalline silicon;

(ii) the deposition by Plasma-Enhanced Chemical Vapor Deposition (PECVD) of a layer of monocrystalline silicon by epitaxial growth with a growth rate gradient on the monocrystalline silicon layer obtained in step (i); and (iii) the epitaxial growth of a monocrystalline layer of a semiconductor material on the monocrystalline silicon layer obtained in step (ii), to thus obtain a material comprising at least one fully monocrystalline semiconductor layer.

The deposition of very thin (or ultrafine) layers of monocrystalline silicon by PECVD is already described, for example, in Roca I Cabarrocas et al. 2012 (Pere Roca i Cabarrocas, Romain Cariou, Martin Labrune. Low temperature plasma deposition of silicon thin films: From amorphous to crystalline. Journal of Non-Crystalline Solids, Elsevier, 2012, 358 (17), pp. 2000-2003. <10.1016/j.jnoncrysol.2011.12.113>. <hal-00806450>). However, in the PECVD deposits according to the prior art, the conditions are stationary, i.e. the conditions for generating the plasma do not vary. However, it has been demonstrated by the present inventors that the epitaxial growth rate gradient makes it possible to generate a fragile region in the layer of monocrystalline silicon that is capable of being broken in order to separate the layers in contact on either side of the brittle region of monocrystalline silicon. We may thus easily detach from the first substrate, the monocrystalline silicon and the layers deposited on the face opposite the first substrate.

The term "epitaxial growth rate gradient" is understood to mean PECVD conditions imposing different deposition rates for layers of nanometric thickness. These PECVD conditions may be easily confirmed by the operating parameters of the apparatus capable of performing the PECVD, and which vary during the PECVD stage and/or by variations in the mechanical properties and/or the chemical composition (content in hydrogen, in particular) of the layers thus deposited.

Preferably, the process of the invention comprises, after the epitaxial growth in step (iii), a step (iv) for at least detaching the layer of semiconductor material formed by epitaxial growth in step (iii) for its physical separation from the first substrate, and a step (v) for the transfer of at least the layer of semiconductor material formed by epitaxial growth on a second substrate.

According to a variant, the preparation (i) of the surface of a first substrate comprises the removal of the oxides present on the surface of the first substrate that is intended to receive the layer of silicon.

Any cleaning process known to those skilled in the art may be used for the removal of the oxides present on the surface of the first substrate.

According to one embodiment, the removal of the oxides present on the surface of the first substrate may be carried out by a cleaning process comprising the use of one or more chemical solutions based on hydrofluoric or alkaline acid and/or plasma based on fluoride ($SF_6$, $SiF_4$, $NF_3$, $F_2$).

There is no particular limitation concerning the first substrate as long as it is possible to deposit a layer of silicon on its surface by epitaxial growth. According to one embodiment, the first substrate is chosen from among: Si, Ge, SiGe, or another semiconductor material, such as, for example, a III-V type semiconductor material. As a III-V type semiconductor material, we may mention the compounds of one or more elements of column III (boron, gallium, aluminum, indium, etc.) and of column V (arsenic, antimony, phosphorus, etc.) of the Mendeleev periodic table, such as, for example, GaN, GaP, GaAs, GaSb, InN, InP, InAs, BN, BP, Bas, AlN, AlP, or ternary alloys such as, for example, $In_xGa_{1-x}As$, $Al_xGa_{1-x}As$. We may also cite the semiconductor alloys of elements belonging to group 12 and chalcogens, such as, for example, CdS, CdSe, CdTe, ZnO, ZnS, ZnTe, CdZnTe (CZT), or copper-indium gallium selenide (CIGS).

Typically, the first substrate is a silicon "wafer", i.e. a "slice" or "wafer" of silicon. The silicon wafers may be of various sizes and are generally in the form of a disc with a diameter of 100 mm to 300 mm, or a rectangle with sides from 20 mm to 500 mm. The thickness is generally of the order of 0.1 to 1 mm, and, typically, of the order of 0.3 mm.

Advantageously, after detachment of the material comprising one or more semiconductor layers, the first substrate is recycled for a new use. Typically, the substrate undergoes a cleaning treatment to remove the epitaxial silicon layer and thus present a crystalline silicon surface intended, for example, to receive a new layer of silicon deposited by PECVD, according, for example, to the process of the present invention. We may thus recycle the silicon wafer in the context of the process according to the present invention.

PECVD is a process that is typically used to deposit thin layers on a substrate from a gaseous (vapor) state.

Advantageously, the deposition by PECVD is implemented in an intermediate regime between the epitaxial and microcrystalline regime. The deposition by PECVD according to the present invention thus makes it possible to form at least one brittle layer within the layer of monocrystalline silicon incorporating a high concentration of hydrogen atoms.

Advantageously, the deposition (ii) by PECVD is implemented for the formation of a plasma forming $SiH_3$ radicals, then of a plasma forming silicon clusters.

Thus, the present invention advantageously makes it possible to form a region of brittleness in the same epitaxial growth step of the silicon by PECVD as a result of the deposition conditions.

In particular, the deposition by PECVD comprises a growth rate gradient of the monocrystalline layer of silicon. In particular, this gradient may be produced by different growth rates. It may be a discontinuous variation of the deposition rate, with, for example, two or three different deposition rates, or a continuous variation of the deposition rate. The growth rates by PECVD are determined, for example, by the configuration of the apparatus and/or the deposition conditions. We may thus use, for example, different densities of plasma powers, pressures, gas flow rate, or temperature of the substrate, so as to obtain a growth rate gradient and thus different growth rates.

In various possible embodiments, the present invention also relates to the following characteristics, which may be considered in isolation or according to all their technically feasible combinations, wherein each offers specific advantages, for step (ii) and/or step (iii) of PECVD:

- the duration may be, for example, between 10 seconds and 10 minutes,
- the power density of the radiofrequency plasma may be, for example, from 10 to 250 $mW/cm^2$,
- the pressure of the gas mixture may be, for example, from 200 to 400 Pa,
- the deposition temperature may be, for example, from 100 to 400° C.,
- the gas flow rate of $SiH_4$ may be, for example, from 0.5 to 5 sccm (meaning "standard cubic centimeter per minute" or $cm^3$/min expressed in standard conditions of temperature and pressure),
- the hydrogen gas flow rate may be, for example, from 10 to 500 $Ncm^3$/min (expressed in standard conditions of temperature and pressure).

Alternatively, helium may be used to weaken the silicon layer.

According to a preferred variant, hydrogen may be used to weaken the Si layer.

The presence of hydrogen significantly influences the stability and mechanical stress of the deposited layer. According to the present invention, this property is used to later make it possible to very easily detach the layer(s) deposited on the layer of monocrystalline silicon obtained by PECVD.

Advantageously, the temperature of deposition (ii) by PECVD and of epitaxial growth (iii) is less than 400° C. Such a temperature advantageously makes it possible to reduce the operating cost of the manufacturing process. Advantageously, the temperature of deposition by PECVD and of epitaxial growth is less than 250° C. Typically, the temperature is 200° C.

Advantageously, the silicon layer obtained by epitaxial growth by PECVD has a composition gradient. By composition gradient is meant, for example, a composition having a concentration of hydrogen atoms that varies in the thickness of the silicon layer obtained by PECVD. Typically, according to the present invention, the silicon layer obtained by PECVD has a peak hydrogen concentration. This peak hydrogen concentration is generally at the interface between the substrate and the first epitaxial layer. The peak hydrogen concentration may exceed $1\times10^{21}$ atoms/cm$^3$, and may exceed, for example, $2\times10^{21}$ atoms/cm$^3$. The hydrogen concentration may be, for example, measured by Secondary Ion Mass Spectrometry (SIMS) which is a surface analysis process. We may also speak of a crystallinity gradient for this silicon layer due to the crystallinity defects of the silicon introduced by the hydrogen atoms. We may also speak of density gradient.

According to one embodiment, we may observe the presence of a brittleness region in the entirely monocrystalline material because, by using spectroscopic ellipsometry, the substrate/silicon layer interface exhibits oscillations (interferences) in the photon energy range of 0.7 to 3 eV, and, preferably, in the photon energy range of 1.5 to 2.5 eV.

Advantageously, the deposition by PECVD makes it possible to control the thickness of the deposited layer. The layer may have, for example, a thickness of 1 nm to 10 µm.

Once the silicon layer has been deposited by PECVD, one or more monocrystalline layers of one or more semiconductor materials may be grown on the silicon. According to one embodiment, the monocrystalline layers of the material are not identical and may comprise, for example, different semiconductor materials from one layer to another. According to one embodiment, while the monocrystalline layers of the material may be identical in the chemical nature of the semiconductor material used, the material may possibly differ through doping or physical structuring.

For the layer(s) of semiconductor materials deposited on the silicon layer by PECVD with growth gradient, reference may be made to the semiconductor materials mentioned above.

According to a variant, the epitaxial growth (iii) may be implemented with one or more elements chosen from among: Si, Ge, SiGe.

According to a variant, the epitaxial growth (iii) may be implemented with a technique chosen from PECVD, CVD, MBE, or any of their combinations.

The growth conditions of the epitaxial layer (step (iii)) may be, for example, the following (PECVD): temperature: 200° C., pressure: 307 Pa, power: 35 mW/cm$^2$, SiH$_4$: 4 sccm (Ncm$^3$·min$^{-1}$), H$_2$: 200 sccm (Ncm$^3$·min$^{-1}$), deposition time: 1800 sec.

Typically, the transfer technique (v) on the second substrate is chosen from a technique comprising: anodic bonding, or the use of silicone, a polyimide tape or a high temperature glue (for example Ormostamp®), or any combination thereof.

OrmoStamp® is a hybrid inorganic-organic polymer for the manufacture of transparent working stamps used in Nano-Imprint Lithography (NIL) as an economical alternative to quartz or galvanized stamps. It may be applied in thermal NIL and/or UV NIL.

The invention also makes it possible to produce stacks of doped and/or undoped layers to form P-N, N-P, PIN or NIP junctions, or combinations of such junctions. The doping may be, for example, a phosphorus and/or boron doping with a doping concentration of, for example, $<1\times10^{20}$ at./cm$^3$.

Once the layer(s) of semiconductor materials is/are deposited on the layer of monocrystalline silicon obtained by PECVD according to the present invention, it is possible to easily detach the layer(s) of semiconductor materials from the first substrate, so as to physically separate them from the first substrate. We may, for example, use a heating step (generally referred to as annealing) to a temperature of, for example, 250 to 400° C. This heating step advantageously makes it possible to further weaken the interface between the substrate and the layer of silicon epitaxied by PECVD, which makes it possible to separate the sample into two distinct parts, one comprising the first substrate, the other comprising the layer(s) of semiconductor materials.

Advantageously, several layers of material may be deposited on the silicon epitaxied by PECVD. This advantageously makes it possible to detach a multilayer material from the first substrate. It is thus possible to preform several layers of semiconductor capable of operating in a photovoltaic cell.

Alternatively, heterojunctions may be formed directly on the first substrate. We may, for example, transfer this heterojunction to a second substrate.

The layer(s) of semiconductor materials detached from the first substrate may, therefore, be deposited on a second substrate.

According to a variant, the detachment (iv) of the layer of semiconductor material is carried out by mechanical or thermal treatment, or by any one of their combinations, and carried out, for example, by cleavage at the porous interface by means of the application of mechanical stress, ultrasound and/or water jet. We thus obtain a self-supporting multilayer film. The multilayer film may then be transferred to a second substrate forming a flexible or rigid mechanical support, for example non-crystalline, while the first crystalline substrate may be reused.

Advantageously, the first substrate may be recycled. We may, for example, recycle the first substrate by cleaning its surface. The conditions for cleaning the first substrate are known to those skilled in the art and may be, for example, the conditions for recycling Smartcut™ technology.

According to a variant, the second substrate may be chosen from among: glass, a metal or metal alloy, a polymer, including one chosen from co-polymers, a flexible material, an elastomer, or a thermoplastic elastomer.

According to one embodiment, the second substrate may be supple or flexible, i.e. the mechanical properties of the substrate make it possible to manipulate it physically to substantially modify its physical form by using a force (for example by bending) without breaking the substrate.

The invention relates to a material capable of being obtained by a process according to the present invention.

According to another aspect, the present invention relates to an entirely monocrystalline multilayer material comprising a first substrate on which is deposited a layer of monocrystalline silicon, said entirely monocrystalline material having a substrate/silicon layer interface having a peak atom concentration of hydrogen greater than $1\times10^{21}$ atoms/cm$^3$, and, preferably, greater than $2\times10^{21}$ atoms/cm$^3$.

The invention makes it possible, in particular, to use a very thin (so-called ultra-thin) silicon layer, i.e. of a very thin thickness. This thickness is typically from 1 nanometer (nm) to 10 micrometers (µm), and, for example, from 1 nm to 500 nm, from 1 nm to 200 nm, or even from 1 µm to 10 µm.

According to another aspect, the invention also relates to an entirely monocrystalline multilayer material comprising a first substrate on which a layer of monocrystalline silicon is deposited, said entirely monocrystalline material having a substrate/silicon layer interface having, by spectroscopic ellipsometry, oscillations greater than 0.2 ε, preferably greater than 0.5 ε, in the photon energy range from 1.5 to 3 eV, and preferably in the photon energy range from 1.5 to 2.5 eV.

The multilayer material according to the invention is also designated as a multilayer semiconductor film. A multilayer material comprises or consists of several superimposed layers forming a stack of layers.

Typically, in the entirely crystalline multilayer material, the silicon layer has, on the face opposite to the face in contact with the first substrate, a layer of a monocrystalline semiconductor material.

According to yet another aspect, the invention relates to a multilayer material comprising a substrate on which is deposited a monocrystalline layer of semiconductor material with a thickness of 1 nanometer (nm) to 10 micrometers (μm), and one or more layers of one or more other materials.

According to another aspect, the invention also relates to a multilayer material in which the substrate is chosen from among: glass, a metal or metal alloy, a polymer, including one chosen from co-polymers, a flexible material, an elastomer, or a thermoplastic elastomer. In particular, the invention relates to an entirely crystalline multilayer material.

According to a variant, the substrate may be chosen from among: glass, a metal or metal alloy, a polymer, including one chosen from among co-polymers, a flexible material, an elastomer, or a thermoplastic elastomer.

Among the examples of devices comprising one or more materials according to the invention, we may list, in particular:

P-N junctions;
P-I-N junctions;
P-N/P-N or P-I-N/P-I-N tandem structures;
Heterojunctions;
Any combination of the previous stacks; and
3D electric circuits.

For example, we may refer to an integrated 3D circuit with chips, for example from 5 to 10 μm thick. Such a 3D circuit may be used, for example, as layers in 3D stacks. For example, we may also mention a multilayer material comprising the following layers: glass/ITO/c-Si/ZnO/Ag, where the Si is monocrystalline (c-Si).

Advantageously, the present invention makes it possible to transfer one or more layers of a semiconductor material to be used for different applications.

We may, for example, use a multilayer semiconductor material according to the present invention for the manufacture of silicon on insulator (SOI) plates.

The manufacture of thin multi-layer monocrystalline semiconductor materials (thin film, also known as "thin layer" or "ultra thin layer" if the thickness is very low), is a key step for the development of low cost and/or flexible electronic or photovoltaic devices. The present invention makes it possible to provide such devices.

The present invention relates to a process in which the first substrate is recyclable, a process of manufacturing an inexpensive multilayer semiconductor material, a process of manufacturing layers of an easy-to-implement multilayer semiconductor material, in particular for various industrial applications, and a process for preparing photovoltaic cells.

The present invention also relates to providing new multilayer semiconductor materials, for example for photovoltaic cell applications, in particular for photovoltaic cells whose substrate is not that of growth, or else materials comprising one or more semiconductor layers deposited on a supple or flexible substrate.

The multilayer materials according to the present invention may be used, in particular, in devices comprising one or more thin layers, electronic, optoelectronic devices, and, in particular, semiconductor devices, and, in particular, photovoltaic cells. The invention also relates to the field of nanotechnologies and optoelectronics.

BRIEF DESCRIPTION OF THE DRAWINGS

In the figures:
FIG. 1 represents a measurement by spectroscopic ellipsometry under the conditions of example 1.
FIG. 2 represents a measurement by SIMS under the conditions of example 1.

DETAILED DESCRIPTION

Examples

Example 1

Two multilayer materials were prepared, one according to a process according to the present invention with an epitaxial growth rate gradient of the monocrystalline silicon layer, the other, comparative, with a constant epitaxial growth rate by PECVD.

A thin layer of 600 nm thick silicon was thus prepared according to these two PECVD processes.

For the two samples (comparative and according to the invention), the silicon layer deposited by PECVD is deposited by direct growth on the cleaned silicon wafer (free of native oxide).

For the example according to the present invention, three PECVD plasma conditions were used.

The first PECVD deposition conditions are as follows:
Temperature: 200° C.;
Pressure: 240 Pa;
Power: 35 mW/cm$^2$;
SiH$_4$ flow rate: 2 sccm;
H$_2$ flow rate: 200 sccm;
Duration: 60 sec.

The second PECVD deposition conditions are as follows:
Temperature: 200° C.;
Pressure: 227 Pa;
Power: 17 mW/cm$^2$;
SiH$_4$ flow rate: 1 sccm;
H$_2$ flow rate: 200 sccm;
Duration: 60 sec.

The third PECVD deposition conditions are as follows:
Temperature: 200° C.;
Pressure: 307 Pa;
Power: 35 mW/cm$^2$;
SiH$_4$ flow rate: 4 sccm;
H$_2$ flow rate: 200 sccm;
Duration: 1800 sec.

For the comparative sample, the silicon layer was deposited by PECVD without an epitaxial growth rate gradient only according to the third PECVD deposition conditions.

The results of spectroscopic ellipsometric measurements are illustrated in FIG. 1. It is noted that at low energy, the imaginary part of the pseudo-dielectric function εi exhibits oscillations which are characteristic of the porosity of the interface between the substrate (monocrystalline silicon wafer) and the silicon layer deposited by PECVD. The high porosity of the interface is detected for the sample according to the present invention as illustrated by a high amplitude of the low energy oscillations. The oscillation amplitude is significant compared to the comparative sample. It should be noted that in the higher energy part (greater than 3 eV), the spectrum is very similar to the silicon wafer, thus demonstrating the crystalline quality of the material according to the present invention.

In FIG. 2, the hydrogen concentration profile characterized by SIMS should be noted for the two samples. For the sample according to the present invention, the interface is very porous with a strong accumulation of hydrogen on the surface in contact with the silicon wafer (up to $2.5 \times 10^{21}$ atoms/cm$^3$). Such a concentration peak was not observed in the comparative sample, the hydrogen concentration of which is approximately $3 \times 10^{20}$ atoms/cm$^3$.

Then, for the material according to the invention, the transfer of the silicon layer was successfully carried out on glass, for example by anodic bonding at 200° C. for 10 minutes and then annealing at 200° C. for 5 minutes. On the contrary, for the comparative sample, under the same conditions, it is not possible to detach the layer deposited by PECVD. No detachment is observed even with annealing at 550° C. for 5 minutes, or even when the silicon wafer breaks.

Thus, the process according to the present invention allows a simple transfer at low cost of a semiconductor material on a substrate that may be less expensive than silicon.

Example 2

Under the same conditions as in Example 1, the thin layer of silicon was transferred to a flexible substrate.

It is thus possible to obtain a crystalline semiconductor material on a flexible substrate.

The invention claimed is:

1. A process for the preparation of a semiconductor material comprising at least one entirely monocrystalline semiconductor layer, said process comprising:
   (i) preparing a surface of a first substrate to receive a layer of monocrystalline silicon;
   (ii) depositing by Plasma-Enhanced Chemical Vapor Deposition (PECVD) a layer of monocrystalline silicon by epitaxial growth with a growth rate gradient on the first substrate prepared in (i); and
   (iii) epitaxial growing a monocrystalline layer of a semiconductor material on the monocrystalline silicon layer obtained in (ii), thereby obtaining a material comprising at least one entirely monocrystalline semiconductor layer.

2. The process of claim 1, wherein the process comprises, after the epitaxial growing in (iii), (iv) detaching at least the monocrystalline layer of semiconductor material formed by epitaxial growth at (iii) for its physical separation from the first substrate, and (v) transferring at least the layer of semiconductor material formed by epitaxial growth, onto a second substrate.

3. The process of claim 2, wherein the deposition technique (v) on the second substrate is chosen from a technique comprising: anodic bonding, or the use of silicone, a polyimide tape or a high temperature glue, or any combination thereof.

4. The process of claim 2, wherein the detachment (iv) of the monocrystalline layer of semiconductor material is carried out by mechanical or thermal treatment, or any one of their combinations.

5. The process of claim 1, wherein preparation (i) of the surface of the first substrate comprises the removal of oxides present on the surface of the first substrate intended to receive the silicon layer.

6. The process of claim 1, wherein said PECVD is implemented for the formation of a plasma forming SiH$_3$ radicals then of a plasma forming silicon clusters.

7. The process of claim 1, wherein the temperature of PECVD (ii) and epitaxial growth (iii) is less than 400° C.

8. The process of claim 1, wherein the epitaxial growth (iii) is implemented with one or more elements chosen from among: Si, Ge, SiGe.

9. The process of claim 1, wherein the epitaxial growth (iii) is implemented with a technique chosen from among PECVD, CVD, MBE, or any of their combinations.

10. An entirely monocrystalline multilayer semiconductor material that may be obtained by a process according to claim 1, said entirely monocrystalline multilayer semiconductor material comprising a first substrate on which is deposited a monocrystalline silicon layer, said entirely monocrystalline material having a substrate/silicon layer interface having a peak hydrogen atom concentration greater than $1 \times 10^{21}$ atoms/cm$^3$.

11. The entirely crystalline multilayer semiconductor material according to claim 10, wherein the layer of monocrystalline silicon has a layer of an entirely monocrystalline semiconductor material on the face opposite to the first substrate.

12. An entirely monocrystalline multilayer semiconductor material that may be obtained by a process according to claim 1, said entirely monocrystalline multilayer semiconductor material comprising a first substrate on which is deposited a monocrystalline silicon layer, said entirely monocrystalline multilayer semiconductor material having a substrate/silicon layer interface having, by spectroscopic ellipsometry, oscillations greater than 0.2 ε, in the photon energy range from 1.5 to 3 eV.

13. The entirely crystalline multilayer semiconductor material according to claim 12, wherein the layer of monocrystalline silicon has a layer of a monocrystalline semiconductor material on the face opposite to the first substrate.

14. The entirely monocrystalline multilayer semiconductor material according to claim 11, wherein said entirely monocrystalline multilayer semiconductor material having a substrate/silicon layer interface has, by spectroscopic ellipsometry, oscillations greater than 0.5 ε, in the photon energy range from 1.5 to 3 eV.

15. The entirely crystalline monocrystalline multilayer semiconductor material according to claim 11, wherein said entirely monocrystalline multilayer semiconductor material having a substrate/silicon layer interface has, by spectroscopic ellipsometry, oscillations greater than 0.5 ε, in the photon energy range from 1.5 to 2.5 eV.

16. A semiconductor material characterized in that may be obtained by a process according to claim 1, said semiconductor material comprising at least one entirely monocrystalline semiconductor layer.

17. A multilayer semiconductor material that may be obtained by a process according to claim 1, said multilayer semiconductor material comprising a first substrate on which is deposited a monocrystalline layer of semiconductor material with a thickness of 1 nanometer (nm) to 10 micrometers (μm), and one or more layers of one or more other materials.

18. The multilayer semiconductor material according to claim 17, wherein the substrate is chosen from among: glass, a metal or metal alloy, a polymer, including one chosen from among co-polymers, a flexible material, an elastomer, or a thermoplastic elastomer.

\* \* \* \* \*